US005805799A

United States Patent [19]
Fredrickson et al.

[11] Patent Number: 5,805,799
[45] Date of Patent: Sep. 8, 1998

[54] DATA INTEGRITY AND CROSS-CHECK CODE WITH LOGICAL BLOCK ADDRESS

[75] Inventors: Lisa Fredrickson, Ojai; Clifford Gold, Fremont; Stanley M. Chang, Irvine, all of Calif.

[73] Assignee: Quantum Corporation, Milpitas, Calif.

[21] Appl. No.: 566,361

[22] Filed: Dec. 1, 1995

[51] Int. Cl.[6] .................................................. G06F 11/00
[52] U.S. Cl. ............................... 395/185.05; 371/37.4; 371/40.15
[58] Field of Search .................. 395/185.06, 185.05, 395/185.01, 185.07, 185.02; 371/51.1, 40.1, 67.1, 37.1, 37.7, 40.11, 40.13, 40.14, 40.15, 37.4, 37.5

[56] References Cited

U.S. PATENT DOCUMENTS

| | | | |
|---|---|---|---|
| 4,873,588 | 10/1989 | Hiramatsu | 360/47 |
| 4,910,736 | 3/1990 | Tanaka et al. | 371/37.7 |
| 4,947,484 | 8/1990 | Twitty et al. | 371/37.1 |
| 5,142,539 | 8/1992 | Dahlin et al. | 371/37.1 |
| 5,182,752 | 1/1993 | DeRoo et al. | 371/37.7 |
| 5,241,546 | 8/1993 | Peterson et al. | 371/37.1 |
| 5,283,791 | 2/1994 | Halford | 371/40.4 |
| 5,321,706 | 6/1994 | Holm et al. | 371/51.1 |
| 5,422,895 | 6/1995 | Nguyen et al. | 371/37.5 |
| 5,428,630 | 6/1995 | Weng et al. | 371/40.1 |
| 5,440,571 | 8/1995 | Mok | 371/40.1 |
| 5,485,595 | 1/1996 | Assar et al. | 395/430 |
| 5,487,151 | 1/1996 | Kikuchi et al. | 395/185.02 |
| 5,521,929 | 5/1996 | Weng et al. | 371/40.1 |
| 5,581,541 | 12/1996 | Whetsel | 370/241 |

OTHER PUBLICATIONS

Fettweis et al., A Combined Reed–Solomon Encoder and Syndrome Generator with Small Hardware Complexity, *Proc. IEEE Int. Symp. on Circuits & Systems, ISCAS '92*, San Diego, CA May 1992, pp. 1871–1874.

*Primary Examiner*—Robert W. Beausoliel, Jr.
*Assistant Examiner*—Joseph E. Palys
*Attorney, Agent, or Firm*—David B. Harrison; Debra A. Chun

[57] ABSTRACT

According to the invention, a data integrity code including logical block address ("LBA") and circuit implementation are provided. The code and implementing circuitry are utilized to enable data block LBA verification during a block transfer and retrieval process. The preferred data integrity code has embedded LBA information and also serves as a crosscheck code used to detect miscorrection by an error correction code ("ECC"). In a preferred disk drive embodiment, data integrity block ("DIB") is provided to verify that the LBA value associated with a given data block in a host interface matches the value associated with that same data block in a buffer memory and in a data sequencer. In a preferred method of use, data integrity/cross-check redundancy with LBA is appended to data blocks transmitted to a buffer memory and verified after the data block has been transferred from the buffer. After verification, the LBA is preferably written to the storage medium together with its associated data block to enable later LBA verification for blocks recovered from the storage medium. The LBA may also be verified when the data block is transferred back to a host from the buffer memory.

6 Claims, 4 Drawing Sheets

DATA INTEGRITY AND CROSS-CHECK CODE WITH LOGICAL BLOCK ADDRESS

FIELD OF THE INVENTION

The present invention pertains generally to the field of data coding methods and apparatus for use in data communication and storage systems. More specifically, the present invention pertains to a system architecture that implements a data integrity code with incorporated logical block address ("LBA") information to protect data passed through a buffer memory in a data path and to enable data block LBA verification during a block transfer and retrieval process.

BACKGROUND OF THE INVENTION

In the past, data formats for peripheral storage devices including, for example, disk drive storage devices, have utilized data block address information embedded within a data record associated with the block to determine the physical location of individual data blocks on the storage medium. The individual block locations could then be determined by decoding a multiple bit block identification code that formed part of the overhead for each block of data written to the storage medium.

More recently, data storage and transfer formats have been developed that do not embed data block location information within an identification field in the data record associated with each data block. Instead, internal counters and timers, typically under the control of a supervisory microprocessor, have been used to track the location of data records without the need for embedded identification information. In addition, certain interface protocols, such as the Small Computer System Interface ("SCSI"), for example, may provide logical block address information to the peripheral storage unit that may be used by counter circuits to aid in tracking the data block location. In disk storage drives utilizing a buffered data path, user data are transferred from the host through the interface to a buffer memory, such as a dynamic random access memory ("DRAM"), for example, where the user data are temporarily stored prior to being transmitted through the recording channel and written to the storage medium. In such systems, it would be desirable to provide a mechanism for verifying the LBA of data blocks as they are passed from the host through the buffer memory to the storage medium and then back to the host through the buffer in the reverse path.

In commonly assigned, co-pending patent application Ser. No. 08/497,488, entitled "Method and Apparatus to Protect Data Within a Disk Drive Buffer", a system for utilizing the cross-check code as a data integrity code to protect the buffer memory is disclosed. This application, however, does not disclose the incorporation of LBA information in the redundancy information generated in accordance with the data integrity code. Moreover, LBA information has not been incorporated into a data integrity code that also functions as a cross-check code in systems utilizing a block buffer for temporary data storage in the data path where appended cross-check and data integrity code redundancy with incorporated LBA is transferred with the data block to the storage buffer and also to the storage medium.

Accordingly, it would be desirable to provide a data integrity code that includes LBA information within generated redundancy to protect the block buffer and also to provide additional protection against LBA errors to enhance the probability that correct blocks of data are transferred between circuit components in the data path and the storage medium. It would also be desirable to provide a data integrity code with embedded LBA information that also served as a cross-check code to lower the miscorrection probability of error correction carried out in accordance with an error correction code ("ECC").

SUMMARY OF THE INVENTION

The present invention incorporates LBA information in redundancy generated by a data integrity code used to protect data temporarily stored in a block buffer. Advantageously, the data integrity code may also serve as a cross-check code to reduce the miscorrection probability of an error correction process carried out in accordance with an ECC.

A general object of the present invention is to provide a data integrity block ("DIB") that incorporates LBA information into redundancy generated in accordance with a data integrity code to protect the integrity of data blocks passed through a buffer memory in a data path and to provide a mechanism to verify the LBA of the transferred blocks at discrete points in the data path.

Another object of the invention is to provide a data integrity code having LBA information incorporated into the redundant symbols generated by an encoder block where the generated redundancy symbols optionally serve as part of the cross-check redundancy used to detect miscorrections by the ECC.

A more specific object of the invention is to provide a data integrity/cross-check code having LBA information incorporated into redundancy generated according to the code, and an encoder/detector block for implementing the same in both a host interface and multi-function sequencer circuit to protect data blocks passed through a block buffer memory in a data storage system, where the encoder block produces a word (two bytes) of redundant information having the LBA of each block incorporated therein.

Another more specific object of the invention is to provide a data integrity/cross-check code wherein 16 bits of LBA information are exclusive ORed ("XORed") with a single redundant word to produce a data integrity block word ("DIB word") that is appended to a data block. According to this object of the invention, the DIB word serves three separate functions: (1) to verify the LBA of the data block at different points on a path within the data channel; (2) to protect data blocks temporarily stored in the buffer; and (3) as cross-check redundancy to protect against ECC miscorrection.

In accordance with these and other objects, features, and aspects of the present invention, LBA information is incorporated into redundancy information generated by a data integrity block to provide additional protection against misidentification of data blocks in a block data transfer system.

In a preferred embodiment, a data integrity block ("DIB") is provided as part of an overall data integrity strategy that includes verifying that the LBA associated with a given data block in a host interface matches the LBA associated with the same data block in a buffer memory and in a data sequencer within a data path. The data integrity redundancy with LBA is appended to data blocks temporarily stored in the buffer to permit verification of the LBA after the data blocks have been received at a point downstream of the buffer in the data path. After this verification, the redundancy with LBA is preferably appended to its associated data block on the storage medium to form part of the cross-check redundancy for the data block and to enable later LBA verification when the block is read back from the storage medium.

In the disclosed disk drive example, a DIB word is utilized as one of two cross-check words. The DIB word is generated according to a first cross-check code and is combined with LBA information in the host interface. The DIB word is then appended to the data block from which it was generated to provide data integrity for the buffered data block and a means for LBA verification at different points in the data path. The data integrity and LBA validity for the block may be checked after the block has been communicated to a point downstream of the buffer (in this case the sequencer) by regenerating the redundant word, bitwise XORing the regenerated word with the LBA associated with the data block in the sequencer, and comparing the result to the DIB word received directly from the buffer. Concurrently with this test, the DIB word and the second cross-check word generated in the sequencer are written to the storage medium and appended to the data block on the medium to form two distinct cross-check code words. When the data block is retrieved from the storage medium and transferred to the sequencer, the data recovery process may be tested by comparing the LBA of the recovered data block with the LBA of the data block requested by the sequencer.

The cross-check code provides a convenient vehicle for carrying the LBA of each data block with the block to the buffer and to the storage medium, thus enabling LBA verification for the block at disparate points in the data path to ensure that correct blocks of data are processed by the system. A particularly desirable feature of this aspect of the invention is the ability to use the existing cross-check code in an overall data integrity and LBA verification strategy. This approach adds LBA monitoring capability to the storage device without adding separate data overhead and without requiring large amounts of additional hardware.

In a presently preferred embodiment, the two cross-check words are produced in accordance with different encoder polynomials. The first cross-check codeword is a Reed-Solomon codeword defined by the generator polynomial:

$$G(z)=z-\beta,$$

where $\beta$ is the primitive element in a particular representation of a finite Galois field having 65536 field elements (GF($2^{16}$)), and is equal to the hexadecimal number 0x101. The second cross-check polynomial is a Reed-Solomon codeword defined by the generator polynomial:

$$G(z)=z-\beta^2,$$

where $\beta^2$ is obtained by squaring $\beta$ using the arithmetic of GF($2^{16}$), and is equal to hexadecimal 0x180. In this preferred embodiment, Galois field mathematical operations are performed in accordance with extension field theory as described herein.

One of the primary causes for a mismatch between LBA values is system software coding errors which may cause the misalignment of pointers that determine the location of individual data blocks in the storage medium and in the buffer. Since the system software is typically responsible for maintaining these data pointers, software errors may cause the data pointers to become misaligned, resulting in the erroneous identification and transfer of data blocks. Thus, the incorporation of LBA into a data integrity/cross-check code adds reliability to the data transfer process and at the same time provides a hardware means for the system designer, or field troubleshooter, to use in isolating system software errors that cause erroneous data block identification.

These and other aspects, features, objects and advantages of the present invention will be more fully understood and appreciated upon consideration of the following detailed description of a preferred embodiment of the invention, presented in conjunction with the accompanying drawings, wherein like numerals designate corresponding parts in the several figures.

DETAILED DESCRIPTION OF A PREFERRED EMBODIMENT

1. Write Path

Figure 1:
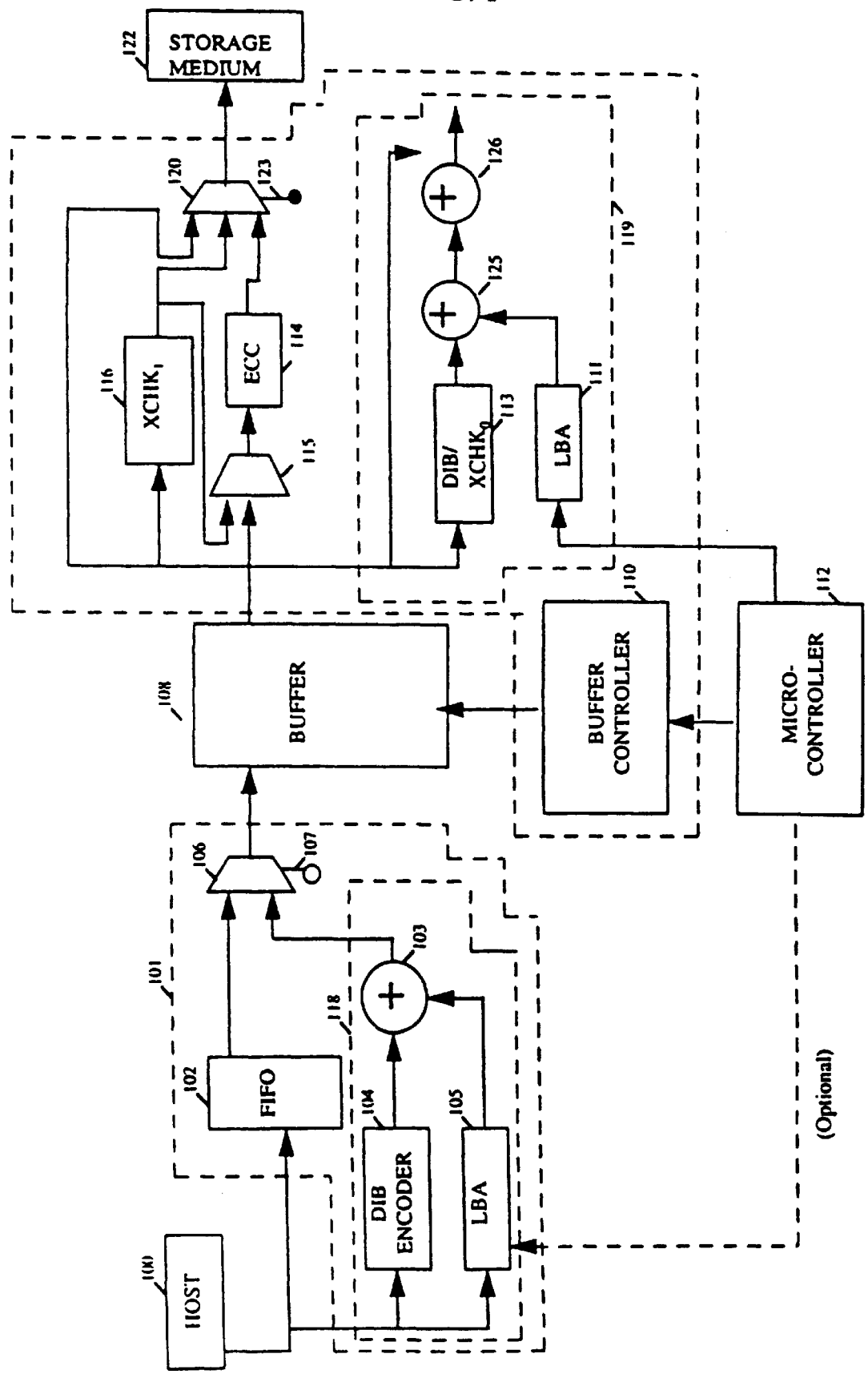
FIG. 1 is a top level block diagram of the write path in a data storage device utilizing a buffer memory where the write path includes circuitry for implementing a data integrity/cross-check code with incorporated LBA information according to the invention.

With reference to FIG. 1, data blocks from a host 100, such as a computer for example, are input to a host interface 101 (illustrated by the dashed box) and transmitted over two separate parallel paths within the interface 101 to temporary storage, preferably a first-in-first-out ("FIFO") buffer 102, and a data integrity block ("DIB") 118 (dashed box). The DIB 118 comprises a DIB encoder 104, LBA counter 105, and a comparison circuit, illustrated as a bitwise modulo 2 adder 103. As shown in FIG. 1, the DIB 118 is preferably implemented together with other elements of the host interface 101 as part of a single Application Specific Integrated Circuit ("ASIC"). The data path into the interface 101, as well as the data paths within the interface 101, may be switched between 8 and 16 bits to accommodate either byte or word size formatting of data from the host 100. Significantly, while the data blocks described herein are formatted as 256 word data sectors (512 bytes), many different block formatting options may be utilized depending on the particular application.

Figure 2:
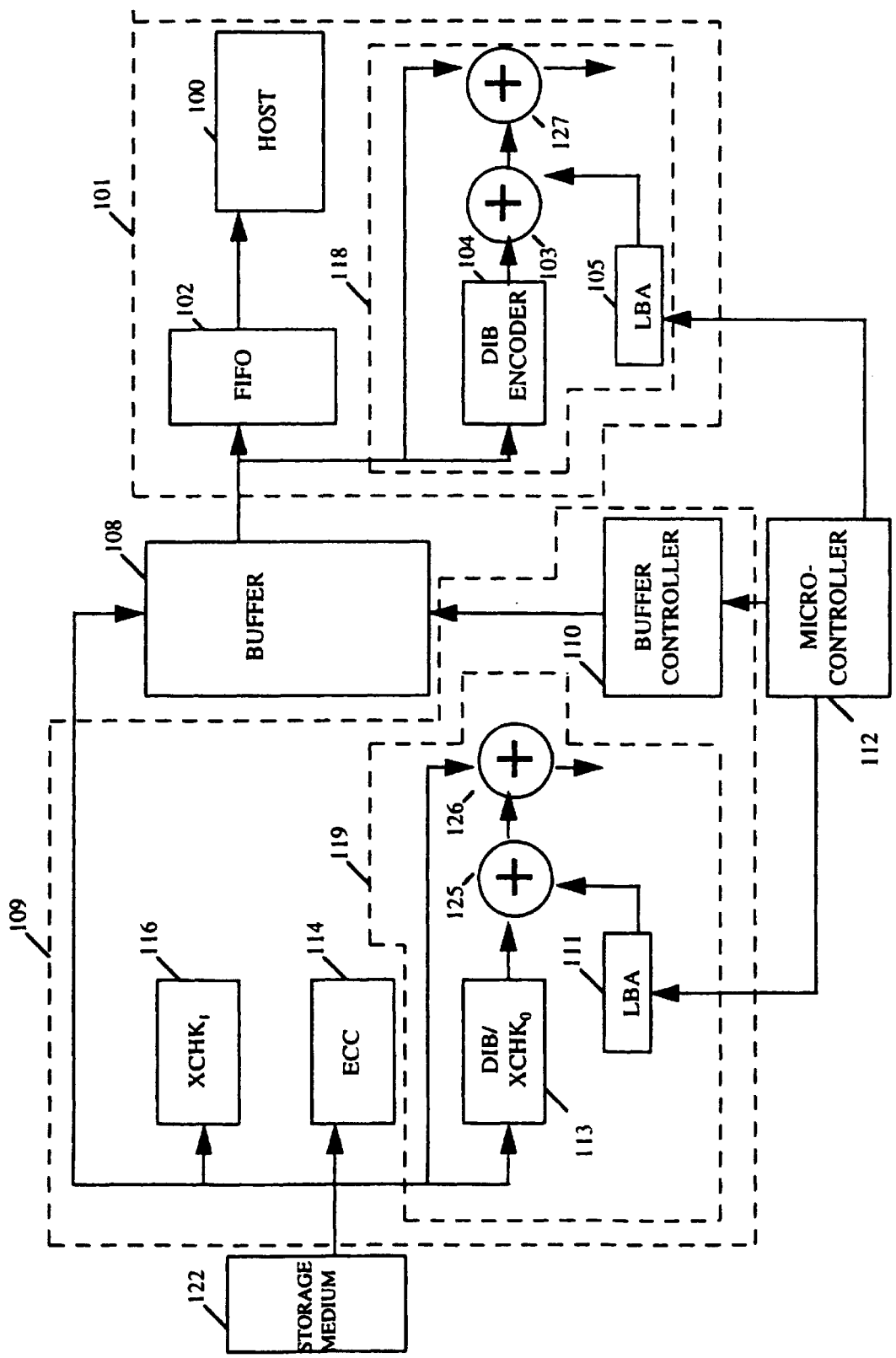
FIG. 2 is a functional block diagram similar to FIG. 1, illustrating the read path in a data storage device where LBA information is incorporated in data integrity/cross-check code redundancy according to the present invention.

In a preferred embodiment, the host 100 outputs data blocks formatted as a sector of N 16 bit data words $\{u_0, u_1, \ldots u_{N-1}\}$ where N=256 for a 512 byte data sector. The data words from the host 100 are simultaneously clocked into the input of the DIB encoder 104 and into the buffer 108 through FIFO 102 in response to a word clock signal provided to the circuit elements within the host interface 101. The FIFO 102 is used to buffer the incoming data words to accommodate variations in transfer rates between the host 100 and the block buffer 108, while block buffer 108 functions as a cache memory to temporarily store a transferred sequence of data sectors prior to the further transfer of the sectors to the sequencer 109. A dynamic random access memory ("DRAM") of sufficient size to store a number of data sectors, such as a 16×64K DRAM, for example, is preferably utilized for the buffer 108. Data transfer to and from the buffer 108 is controlled by a buffer controller 110 which, in turn, is supervised by on-board micro-controller 112. As illustrated in FIGS. 1 and 2, the buffer controller 110 is preferably included within the multi-function sequencer 109 architecture.

In this particular example, data sectors clocked into the DIB encoder 104 are encoded according to a 16 bit Reed-Solomon code that operates over a finite Galois field having 65,536 elements (GF(65,536) or GF($2^{16}$)), represented as an extension field, to produce a single redundant word, $d_0$, in response to an incoming sector of data words, $\{u_0, u_1, \ldots u_{255}\}$. After all the data words in the sector have been clocked through the DIB encoder 104, the encoder 104 outputs $d_0$ to the input of bitwise modulo 2 adder circuit 103, which in practice may be implemented as a parallel array of 16 XOR gates. The redundant word, $d_0$, is then bitwise XORed with the lower 16 bits of the LBA value provided by LBA counter 105 to the input of adder 103. The result of this operation is a single redundant word including LBA information, $x_N$. For the sake of clarity, $x_N$ will also be referred to as the DIB word to distinguish it from the redundant word $d_0$ provided at the output of the DIB encoder circuit 104, which does not include LBA information. As will be explained further below, $x_N$ serves a dual function as the DIB word for data integrity and LBA checking, and as the first cross-check word, $XCHK_0$, for cross-checking data correction carried out by the ECC 114. (The DIB word will be referred to as DIB/$XCHK_0$ or simply as $XCHK_0$ in connection with the cross-check function).

In order to implement both a data integrity code and a cross-check code, the DIB encoder 104 encodes the incoming data sectors according to the same cross-check code implemented in the DIB/$XCHK_0$ encoder 113 located in the sequencer 109. Since the DIB encoder 104 in the host interface 101 and the DIB/$XCHK_0$ encoder 113 in the sequencer 109 implement the same codes, the same encoder circuits may be utilized in both places. During the clock periods when the data words $\{u_0, u_1, \ldots u_{255}\}$ are transferred to the buffer 108, the select line 107 of multiplexer 106 is set to a logic level that connects the data path from the FIFO 102 to the buffer 108. After all the data words of the data sector being transferred have passed through the multiplexer 106 to the buffer 108, the logic level of the select line 107 is switched to connect the output of adder 103 to the buffer 108. This causes the adder 103 output, which in the illustrated example is the DIB word $x_N$, to be appended to the sector of data in the buffer 108 to produce a DIB codeword $B=\{b_0, b_1, \ldots, b_N\}$ of length N+1 where $b_i=u_i$ for i=0 to N-1, and where $b_n=x_N$.

The LBA block 118 includes a sequential counter circuit 105 that receives an initialization value from a storage register (not shown). In the case of a SCSI interface operating in conjunction with a SCSI host, for example, the storage register may receive an initial LBA value through the Command Description Block ("CDB") sent by the SCSI host 100 when a read or write command is initiated. Alternatively, the storage register may be accessed and initialized by the micro-controller 112. The LBA counter 105 reads the initialization value from the register and then increments the LBA count as each sector of data is received from the host 100 and transferred to the buffer 108.

After the single redundant word $x_N$ has been appended to the data sector stored in the buffer 108, DIB codewords are transferred from the buffer 108 to a sequencer circuit 109 through the buffer controller 110. After entering the sequencer 109, DIB codewords from the buffer 108 pass through multiplexer 120 and are serially written to the storage medium 122 by a data transducing head in conventional fashion. When written to the storage medium 122, a DIB codeword forms the first cross-check code word, $C=\{c_0, c_1, \ldots c_{N-1}, C_N\}$, where $c_i=b_i$ for i=0 to N and where $c_N$ is the cross-check word $XCHK_0$.

User data transferred from the buffer 108 to the medium 122 are also transmitted over parallel data paths in the sequencer 109 to an ECC encoder circuit 114, to $XCHK_1$ 116 and to DIB/$XCHK_0$ encoder 113. The ECC encoder 114 also receives and encodes the DIB word, $x_N$, from the buffer 108 after the data sector words have been received and encoded. The $XCHK_1$ 116 encoder generates the second cross-check word, $XCHK_1$, (labeled as $x_{N+1}$ in FIG. 1) in response to the received data sector words only (and not the $x_N$ word) according to the $XCHK_1$ (x) generator polynomial. After the last word of the data sector, $b_{N-1}$, has been clocked through the $XCHK_1$ circuit, the redundant $XCHK_1$ word, $x_{N+1}$, is output to the ECC circuit 114 through multiplexer 115 and is encoded by the ECC 114. At the same time, multiplexer 120 is switched via select line 123 to permit $x_{N+1}$ to pass through and be written to the storage medium 122, where together with the data sector words $\{c_0, c_1, \ldots c_{N-1}\}$, it forms the second distinct cross-check code word on the storage medium 122, i.e., $\{c_0, c_1, \ldots c_{N-1} c_{N+1} = x_{N+1} = XCHK_1\}$.

The DIB/$XCHK_0$ encoder 113 is included within a DIB/$XCHK_0$ function block 119 that also includes LBA counter 111 and first and second bitwise modulo 2 adders 125 and 126. The DIB/$XCHK_0$ encoder 113 generates a redundant word, $d_0'$, in response to the data words $b_i$ received from the buffer. Because the DIB/$XCHK_0$ encoder 113 in the sequencer 109 utilizes the same code as the DIB encoder 104 in the host interface 101, $d_0'$ should match $d_0$ if no data errors have occurred during the transmission of the data through the buffer 108. In the present architecture, however, in order to perform a data integrity check on data from the buffer 108, the LBA value maintained by the LBA counter 111 in the sequencer 109 must first be bitwise XORed with $d_0'$ in first adder 125 to generate the redundant word $x_N'$. The $x_N'$ word is then compared to the redundant word $x_N$ from buffer 108 in second adder 126 after the all of words, $b_i$, of the data sector have been clocked through the DIB/$XCHK_0$ encoder 113 and $x_N$ is received from the buffer 108 by second adder 126. The comparison is performed by bitwise XORing $x_N'$ with $x_N$. If $x_N'$ and $x_N$ are the same, the data are assumed to be error free and the LBA of the data sector is also assumed to be correct. If, on the other hand, $x_N'$ and $x_N$ are not the same, a DIB error is reported to micro-controller 112 and appropriate corrective action, such as requesting that the host 100 resend the data sector, may be taken.

Because LBA information is included within the redundant words, $x_N'$ and $x_N$, in addition to data integrity errors associated with the transmission of data through the buffer 108, a reported DIB error may also be caused by a mismatch of the LBA included within the DIB word, $x_N$, and the LBA supplied by the LBA counter 111 in the sequencer 109 for the particular data sector. As previously mentioned, LBA errors may be caused by software coding errors which cause pointers into the buffer 108 to point to the wrong memory location for the desired data sector. When this happens, the incorrect sector will be transferred from the buffer 108 to the sequencer 109 and an LBA error will result. The inclusion of LBA information in the data integrity code thus provides a convenient hook for debugging the system software and enhancing the overall reliability of the data transfer process.

While the data integrity and LBA verification tests are being performed in the sequencer 109, the ECC encoder circuit 114 receives the data input of $\{b_0, b_1, \ldots b_{N-1}, b_N =x_N=XCHK_0, b_{N+1}=x_{N+1}=XCHK_1\}$, and outputs a predetermined number of ECC check bytes (labeled "ECC" in FIGS. 1 and 2) in response thereto. Since both cross-check words $XCHK_0$ and $XCHK_1$ are input into the ECC encoder 114 and encoded together with the incoming data sector, the ECC check bytes generated by the ECC encoder 114 protect both the data words and the cross-check words appended on the medium 122. This provides the ECC 114 with the capability to correct errors that occur in the cross-check words as well as the data words when recovered from the storage medium 122.

Figure 3:
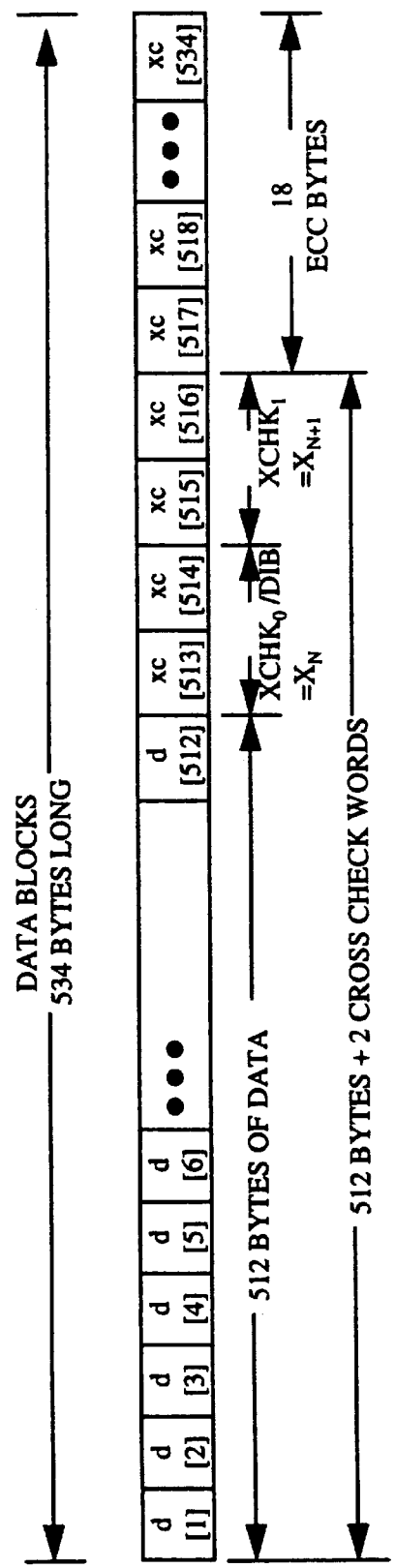
FIG. 3 illustrates the format of a data block written to a storage medium in accordance with aspects of the invention. The block includes 512 bytes of data, followed by two pairs of cross-check bytes, XC[513] through XC[516], which form cross-check words $XCHK_0$ and $XCHK_1$, respectively, followed by 18 error correction bytes, ECC[517] through ECC[534].

In a presently preferred embodiment, ECC 114 generates 18 ECC check bytes (shown as ECC[517] through ECC [534] in FIG. 3) in response to each data sector and the two associated cross-check words. These 18 ECC check bytes pass through multiplexer 120 and are appended to the data sector immediately following the $XCHK_1$ word as shown in FIG. 3 after all the data words and the two cross-check words, $XCHK_0$ and $XCHK_1$ have been encoded by the ECC 114 and output to the storage medium 122 over the separate parallel path within the sequencer 109. When the ECC check bytes are clocked out of the ECC 114, the logical state of the select line 123 of the multiplexer 120 is switched to permit the ECC check bytes to pass through and be written to the storage medium 122 in conventional fashion.

Turning briefly to FIG. 3, the 18 ECC check bytes together with the previously written data words and cross-check words form a single Reed-Solomon ECC code word on the storage medium 122: $\{c_0, c_1, \ldots c_{N-1}, c_N=x_N, c_{N+1}=x_{N+1}, ECC\}$. As illustrated in FIG. 3, the structure of an exemplary 534 byte ECC code word has 512 bytes of data, i.e., one sector, followed by $XCHK_0$ (XC[513] and XC[514]) and $XCHK_1$ (XC[515] and XC[516]), followed by 18 ECC bytes, ECC[517] through [534].

2. Read Path

Referring now to FIG. 2, in read mode, an ECC codeword previously written to the storage medium 122 is read back as the readback codeword $c_i'=\{c_0', c_1', \ldots c_{N-1}', c_N'=XCHK_0', c_{N+1}'=XCHK_1', ECC'\}$ and input to the sequencer 109. In the sequencer 109, the recovered data words, $c_0', c_1', \ldots c_{N-1}'$, together with the $XCHK_0'$ word, $x_N'$, are communicated over a path directly to the buffer 108 for temporary storage prior to further transfer. Simultaneously with this transfer, the second cross-check codeword, $\{c_0', c_1', \ldots c_{N-1}', c_{N+1}'=XCHK_1'\}$, is input to the $XCHK_1$ block 116 and the entire ECC code word, $c_i'$, is input into the ECC 114 for ECC remainder recovery and syndrome generation. The $XCHK_1$ block 116 generates a cross-check syndrome based on the recovered second cross-check codeword which is used to increase the statistical probability that corrections carried out by the ECC 114 are properly performed.

The first cross-check code word recovered from the medium 122, $\{c_0', c_1', \ldots c_{N-1}', c_N'=XCHK_0'\}$ is received as an input to the $DIB/XCHK_0$ encoder 113 in $DIB/XCHK_0$ block 119, which includes LBA counter 111 and first and second bitwise modulo 2 adders 125 and 126. The $DIB/XCHK_0$ encoder 113 decodes, by reencoding, the received data words, $c_0', c_1', \ldots c_{N-1}'$, to produce a redundant word, $d_0''$, according to the same code utilized to generate the redundant word $d_0$ in the DIB encoder 104 in the host interface 101. First adder 125 bitwise XOR's $d_0''$ with the lower 16 bits of the LBA value associated with the particular data sector in the sequencer 109 to produce $x_N''$. For a purpose that will soon become apparent, the $XCHK_0$ block 113 also generates cross-check syndrome values based on the entire received first cross-check codeword, $\{c_0', c_1', \ldots c_{N-1}', c_N'\}$.

The LBA counter 111 maintains an incremental LBA count for data sectors received by the sequencer 109 from the medium 122, and may be provided with an initialization value by micro-controller 122. As was the case with the LBA counter 105 in the write path, the initialization value may be received through the CDB upon institution of a SCSI read command. The regenerated redundant word, $x_N''$, is output from first adder 125 to the input of second adder 126 where it is compared to $x_N'$, received by second adder 126 from the storage medium 122 at the same time. Adder 126 then compares $x_N'$ to $x_N''$ by bitwise XORing them together. A non-zero result indicates that either one or more data errors have occurred, or that an LBA error has occurred.

Although the cross-check syndromes must be updated or reconstituted when a data error is detected to correctly perform the cross-check function (because they are based on what the ECC 114 has determined to be erroneous data), the same is not true of the DIB word in the buffer 108, $x_N'$. This is because $x_N'$ is preferably written directly to the buffer 108 directly from the storage medium 122, rather than being taken as the redundancy output of the $DIB/XCHK_0$ encoder 113, which could be based on erroneous data. This architectural feature, together with the ECC's 114 ability to detect and correct errors to the DIB word in the buffer 108 as discussed below, makes it possible for $x_N'$ to be delivered directly to the buffer 108 from the storage medium 122 and utilized as the DIB word for the return data path through the buffer 108 to the host interface 101. Significantly, it is only the LBA verification aspect of this code that requires the DIB word to be regenerated in the read path in the sequencer 109 for comparison with $x_N'$. If the code only served as a data integrity code and not additionally for LBA verification, this test could be omitted.

If an ECC 114 protected data error is detected, the ECC 114 will attempt to correct data errors in the buffer 108, provided that they fall within the correction capabilities of the code. To start the correction process, the ECC 114 calculates syndrome values based on the recovered code word from the storage medium 122. The ECC 114 then solves the syndromes to determine error location and pattern values for the data errors. In this regard, it should be recalled that because the cross-check words, $XCHK_0$ and $XCHK_1$, are encoded by the ECC 114, the ECC 114 possesses the ability to correct errors in the cross-checks as well as in the data. This capability is important because the $XCHK_0'$ word from the storage medium 122 is transferred to the buffer 108 as the DIB word $x_N'$ for the path back to the host interface 101, and, if the system is to work properly, it is necessary for this word to accurately characterize the data sector and sector LBA that it is designed to protect.

Again, assuming the data errors have been detected, after the ECC module 114 calculates error location and pattern values, the two distinct cross-check codes are utilized to determine whether the ECC corrections are proper. This process involves updating the syndromes generated by $XCHK_0$ 113 and $XCHK_1$ 116 to properly reflect the ECC 114 determined correction values. If both the $XCHK_0$ and $XCHK_1$ recalculated syndromes equal zero, it is assumed that the ECC 114 has properly corrected the data words (and the DIB word, $x_N'$, if necessary) in the buffer 108. In practice, this correction may be carried out by micro-controller 112, which corrects byte errors after receiving the error location and error value from the ECC 114 by accessing the erroneous data byte (or the DIB bytes, $x_N'$, as the case may be) in the buffer 108 and XORing the erroneous byte with the correction value to correct the byte. In describing the error correction mechanics in terms of byte correction, it has been assumed that a byte-wise Reed-Solomon ECC code will be utilized. It should be noted, however, that different symbol length ECC codes, such as a 16 bit symbol code for example, may be utilized.

On the other hand, if only the $XCHK_1$ syndrome equals zero, and the $XCHK_0$ syndrome is non-zero, it is likely that the ECC 114 has properly determined the error correction values and the cause of the miscomparison is an LBA rather than an ECC error. In this case, appropriate corrective action may be taken by the system software after the DIB error has been reported to the micro-controller 112.

Still referring to the read path illustrated in FIG. 2, in the previous discussion it has been assumed that the ECC 114 has detected one or more errors in the data transferred from the storage medium 122 to the sequencer 109. In the case where there are no ECC detected errors in the data sector or the cross-check/DIB redundancy transferred from the storage medium 122 to the buffer 108, and a DIB error is detected by the $DIB/XCHK_0$ block 119, it may be assumed that a mismatch between the LBA of the data sector read from the storage medium 122 and the LBA for this sector maintained by the LBA counter 111 in the sequencer 109 has occurred. This indicates that either the incorrect sector of data was read from the storage medium 122, or that the LBA from the LBA counter 111 is incorrect. To recover from this error, firmware executed by micro-controller 112 may initiate one or more rereads of the sector from the storage medium 122 until a DIB error is not reported, or it is determined that an unrecoverable LBA error has occurred.

After the data and DIB redundancy have been transferred to the buffer 108, and any required error correction or rereads as described above have been performed, the data sector words, $b_0', b_1', \ldots b_{N-1}'$, followed by the appended DIB word $x_N'$ are sequentially clocked out of the buffer 108 through the buffer controller 110 to the host interface 101. In the host interface 101, the data sector words are communicated to the host 100 (through FIFO 102) and the data words followed by $x_N'$ are communicated over a parallel path directly to the DIB encoder 104. The LBA and data integrity of the data sector in the host interface 101 may be verified by the DIB 104 in a manner substantially similar to the process previously described.

The DIB encoder 104 regenerates a word, $d_0''$, based on the data words $\{b_0', b_1', \ldots b_{N-1}',\}$ using the same cross-check encoding algorithm utilized in the $DIB/XCHK_0$ encoder 113 in the sequencer 109. The regenerated word, $d_0''$, is then bitwise XORed with the lower 16 bits of LBA provided by LBA counter 105 in bitwise modulo 2 adder 103 to produce the redundant word including LBA, $x_N''$. LBA counter 105 is initialized by the micro-controller 112 in the manner previously described, and maintains an incremental count of the LBA for the particular data sector entering the host interface 101 from the buffer 108. The $x_N''$ word is input to a second bitwise modulo 2 adder 127 and compared bitwise to $x_N'$ which arrives from the buffer 108 at the input of the adder 127 during the same clock cycle. If $x_N''$ are $x_N'$ are equal, the data are assumed to be correct and the LBA of the data sector is also assumed to be correct. If, on the other hand, $x_N''$ and $x_N'$ are not equal, a DIB error is reported to the micro-controller 112 and appropriate corrective action, such as requesting that the data be reread, may be taken.

3. Combined DIB Encoder/Cross-Check Syndromer Circuit Implementation

Figure 4:
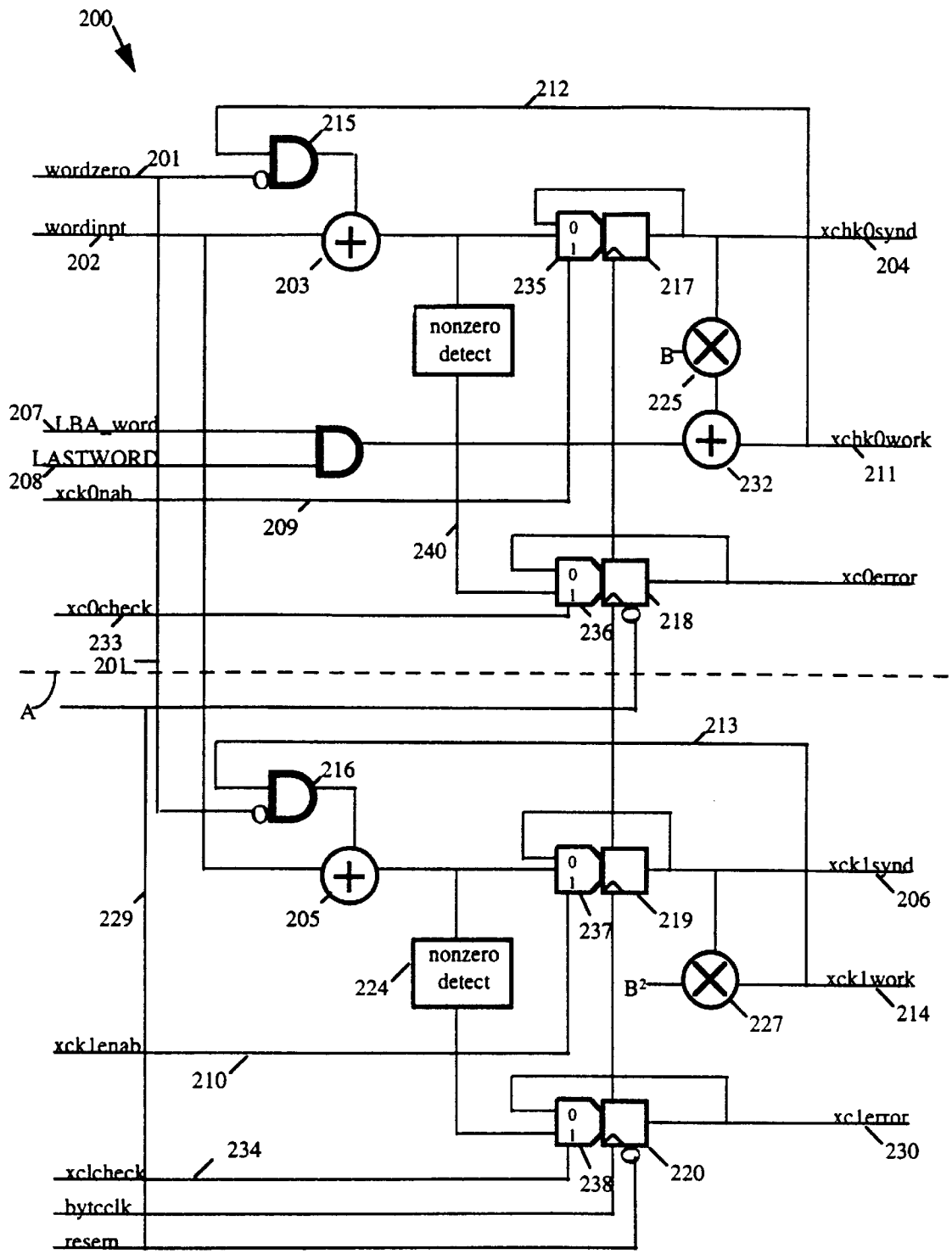
FIG. 4 is a circuit diagram of a presently preferred implementation of a combined syndromer and checker that may be used to implement the DIB, DIB/$XCHK_0$ and $XCHK_1$ function blocks shown in FIGS. 1 and 2.

FIG. 4 illustrates a presently preferred combined encoder/syndromer and checker circuit 200 that contains the circuitry needed to implement the DIB block 118 in the host interface 101 and the $DIB/XCHK_0$ and $XCHK_1$ blocks 119 and 116 in the sequencer 109. As is apparent from inspection, the circuit 200 of this particular embodiment is, in reality, two separate circuits that are utilized to implement two distinct coding equations to form two distinct cross-check code words.

To perform the DIB encoding/decoding and checking operations performed by the DIB block 118 in the host interface 101, only that portion of the circuit 200 lying above the dashed line labeled "A" in FIG. 4 (the "upper half") is preferably utilized. Conversely, in order to generate cross-check syndromes for use in the ECC process based on two distinct cross-check code words, and to perform LBA verification in the host interface 109 as taught herein, the entirety of the circuit 200 is implemented in the sequencer 109 as the $DIB/XCHK_0$ block 119 and the $XCHK_1$ block 116.

Regardless of whether implemented in the sequencer 109 or the host interface 101, the circuit 200 of the present example is adapted to process word length data in accordance with a 16 bit, i.e., wordwise, Reed-Solomon code over $GF(2^{16})$ while receiving a byte clock clocking signal. To properly process received data sector words when provided with a byte clock signal, the storage registers 217, 218, 219 and 220 within the circuit 200 are configured with corresponding input multiplexers 235, 236, 237, and 238. During operation, registers 217, 218, 219 and 220 receive the byte clock signal (byteclk) over a common clock signal line 226. Every other byteclk cycle, the corresponding input multiplexers 235, 236, 237 and 238 are enabled via their select lines so that after two byte clock cycles one word of data (i.e., two bytes) is held in the respective storage registers. For example, the xck0enab and xck1enab signals are supplied over lines 209 and 210 as the respective select inputs of multiplexers 235 and 237 to permit data words to be clocked through registers 217 and 219 in accordance with the particular 16-bit code being implemented.

The operation of the-circuit 200 as the DIB block 118 in the host interface 101 will now be separately described with reference to its write path operation as an encoder, and its read path operation as a decoder and checker.

During write mode, user data $u_i$ from the host 101 are received on the wordinpt bus 202 and provided to the input of XOR gate array 203. (Heavy lines in FIG. 4 indicate a word wide, i.e., 16 bit, data bus whereas thin lines indicate a single signal line). The beginning of a data sector, and the start the encoding process for that sector, is marked by the assertion (i.e., raised to a logic level of "1") of the wordzero signal on line 201. This signal is supplied to inverted inputs of AND gate array 215 (only one AND gate is shown for simplicity) to initialize the storage register 217 to the first received data word, $u_0$. The assertion of wordzero causes the AND gate array 215 to produce a zero output which disables the feedback path 212 and initializes the storage register 217 to $u_0$.

For the next N−1 words, the wordzero signal on line 201 is deasserted to permit feedback multiplication. During this time, the lastword signal on line 208 is also deasserted, and user data $u_i$ are passed to the input of XOR gate array 203 where they are added modulo 2 to the values on the feedback path 212. The result of the modulo 2 summation is clocked through register 217 (according to the xck0enab signal supplied over line 209 to the select line of multiplexer 235)

and multiplied by the fixed value, β, in the Galois field multiplier 225 to produce:

$$xck0work_N = \sum_{i=0}^{N-1} u_i \beta^{N-1-i},$$

which is available on the xck0work bus 211.

When the last word of user data to be encoded, i.e., $u_{N-1}$, is input to XOR gate array 203, the lastword signal is asserted over line 208 to the input of AND gate array 231. This allows the LBA word on the LBA_word signal bus 207 to pass to the input of XOR gate array 232 where it is bitwise XORed (added modulo 2) with the output of the β multiplier 225. This produces:

$$xck0work_N = LBA + \sum_{i=0}^{N-1} u_i \beta^{N-1-i} = x_N,$$

on the xck0work bus 211. (The "+" sign in the equations given in this specification indicate modulo 2 addition). Thus, after all N words of data have been processed, the redundant word including LBA, $x_N$, is generated and output on the xck0work signal bus 211. As previously explained, $x_N$ is passed through multiplexer 108 and appended to the data words $u_i$, for i=0 to N−1, previously stored in the buffer 108 to form a DIB codeword therewith.

When the LBA is zero, the choice of xN provides that the encoded block of data in the buffer 108:

$$\{b_0, b_1, \ldots b_{N-1}, b_N\} = \{u_0, u_1, \ldots u_{N-1}, x_N\}$$

is a Reed-Solomon codeword over GF(65536) with a generator polynomial of the form:

$$G(z)_{DIB/XCHK0} = z - \beta.$$

where β is the primitive element of a finite Galois field having 65536 field elements (GF($2^{16}$)), and is equal to 0x101.

During read mode, operation of the circuit 200 as the DIB block 118 in the host interface 101 is identical except that data words received over the wordinpt data bus 202 comprise the readback words from the buffer 108, $b_i'$, where $b_i' = \{b_0', b_1', \ldots b_{N-1}', b_{N'=xN}'\}$, and an LBA and data integrity check is performed. After the user data portion of the DIB word, i.e., the first N words of buffered data $b_i'$, have been clocked through the upper half of the circuit 200, the DIB word, $x_{N'} = b_{N'}$, from the buffer 108 is input to XOR gate array 203 on the wordinpt bus 202. During the same word clock cycle, the LBA word on the LBA_word bus 207 is passed to the input of XOR gate array 232 through AND gate array 231 in accordance with the assertion of the lastword signal on line 208. The LBA word is then added modulo 2 with the output of the β multiplier 225, to create the regenerated DIB word $x_{N''}$ based on the first N words (the data portion) of the buffered codeword.

The LBA and data integrity test for the readback buffered codeword, $b_i'$, is performed over this same last word clock cycle when $x_{N'}$ is input to XOR gate array 203 and added modulo 2 with the regenerated DIB word $x_{N''}$, supplied on the feedback path 212. The modulo 2 addition of $x_{N''}$ with the incoming DIB word $x_{N'}$ from the buffer 108 yields a zero result if the two values are equivalent, in which case a correctly received code word can be safely assumed. Nonzero detector 222 is utilized to test the output of the XOR gate array 203 for a nonzero result, where a nonzero result indicates the occurrence of either an LBA error or a data integrity error, which should be rare. A nonzero result is reported as the dicerror signal over line 240 to the input of multiplexer 236 and storage register 218 which, in combination, form a latch for holding the dicerror signal in accordance with the xc0check signal supplied to the multiplexer 236 via select line 233. The dicerror signal is made available to the sequencer 109 and the micro-controller 112 on the xc0error line 228 at the output of the storage register 218. Micro-controller 112 is preferably programmed with the capability to take the appropriate corrective action, such as requesting the sequencer 109 to cause the data sector to be reread, for example. The sequencer 109 may also include the capability to take corrective action independent of the micro-controller 112.

The operation of the circuit 200 as implemented in the sequencer 109 will now be described. As previously pointed out, both the upper and lower halves of the circuit 200 are preferably included in the sequencer 109 with the upper half functioning as the DIB/XCHK$_0$ block 119 and the lower half functioning as the XCHK$_1$ block 116. Because both halves of the circuit 200 are implemented in the sequencer 109, the wordinpt bus 202 is connected to both XOR gate arrays 203 and 205, which form the input for the respective upper and lower halves of the circuit 200.

During write mode, the entire DIB codeword, $b_i$, from the buffer 108 is clocked into the circuit 200 over the wordinpt bus 202. The upper DIB/XCHK$_0$ half of the circuit 200 processes all N words of $b_i$ in accordance with the same coding equation implemented in DIB/XCHK$_0$ block 118 in the host interface 101 and regenerates the DIB word as $x_{N'}$. An LBA and data integrity test is then performed based on a comparison of the DIB word $x_N$ from the buffer 108, and the regenerated DIB word $x_{N'}$ in the same manner as previously described with respect to the operation of the upper half of the circuit 200 in the read path of the host interface 101. An error signal resulting from a miscomparison may be latched in the storage register 218 and made available to the micro-controller 112 and sequencer 109 as before.

Operation of the lower half of the circuit 200 as the XCHK$_1$ encoder 116 in the write path of the sequencer 109 is similar to the operation of the upper half of the circuit 200 as the DIB/XCHK$_0$ encoder 104 during write mode in the interface 101, except that a different encoding equation is utilized. In contrast to the input received by the upper half of the circuit 200, which also functions as a checker, and hence needs to receive the redundant word $x_N$ to perform that function, only the data portion of the buffered codeword, i.e., the first N words of $b_i$, are preferably input to the input XOR gate array 205 array over the wordinpt bus 202.

Encoding operation commences when the first word from the buffer, i.e., $b_0$, is provided to the input of XOR gate array 205. At the same time $b_0$ arrives, the wordzero signal is asserted over line 201 to the inverted input of AND gate array 216 to zero the feedback line 213 and initialize the storage register 219 to $b_0$. For the next N−1 words, the wordzero signal over line 201 is deasserted and each incoming data word, $b_i$, is clocked into the XOR gate array 205, added modulo 2 to the contents of the feedback path 213 and the resulting value stored in the storage register 219 in accordance with the xck1enab signal applied over line 210 to the select input of multiplexer 237. For each clock cycle, the contents of the feedback path 213 comprises the clocked out previous contents of the storage register 219 after multiplication by $\beta^2$ in Galois field multiplier 227.

After all N word clock cycles have been completed, the second cross-check word, XCHK$_1$ = $x_{N+1}$, is generated, and made available on the xck1work bus 214:

$$x_{N+1} = \sum_{i=0}^{N-1} b_i \beta^{2(N-1-i)} = XCHK_1$$

The $XCHK_1$ value is steered to the input of the ECC block 114 and is also appended to the stored data sector $c_i$ on the medium 122 to form the second distinct cross-check codeword therewith. The choice of $x_{N+1}$ provides that the second cross-check codeword stored on the medium:

$$\{c_0, c_1, \ldots c_{N-1}, c_{N+1}\} = \{b_0, b_1, \ldots b_{N-1}, x_{N+1}\},$$

is a Reed Solomon codeword over GF(65536) with a generator polynomial of the form:

$$G(z)_{XCHK1} = z - \beta^2,$$

where $\beta^2$ is the primitive element of $GF(2^{16})$ and is equal to 0x180.

The operation of the circuit 200 in the read path of the sequencer 109 will now be described. During read mode, the two cross-check words from the medium 122 are directed to the respective inputs of the input XOR gate arrays 203 and 205, with the XOR gate array 203 receiving the first readback cross-check word, $\{c_0', c_1', \ldots c_{N-1}', c_N' = XCHK_0'\}$, and the XOR gate array 205 receiving the second readback cross-check code word, $\{c_0', c_1', \ldots c_{N-1}', c_{N+1}' = XCHK_1'\}$. The recovered data words and redundancy that comprise these two distinct cross-check codewords are clocked through the respective upper and lower portions of the circuit 200 in the same manner as previously described.

On the word clock cycle following the last input word, feedback multiplication by the respective halves of the circuit 200 produces a first cross-check syndrome value, $S_0$, on the xck0synd bus 204:

$$S_0 = \sum_{i=0}^{N} c_i' \beta^{N-i}$$

and a second cross-check syndrome value, $S_1$ on the xck0synd bus 206:

$$S_1 = \sum_{i=0}^{N} c_i' \beta^{2(N-i)}$$

A nonzero syndrome value for the $S_1$ syndrome, as detected by nonzero detector 222, indicates that one or more data errors have occurred during storage, whereas a nonzero value for the $S_0$ syndrome, as detected by the nonzero detector 224, indicates either one or more data errors and/or an LBA error has occurred. This is because the $S_0$ syndrome is calculated based on the readback $DIB/XCHK_0'$ word, which preferably includes LBA information, such that an LBA error in the sequencer 109 will manifest itself in the calculated $S_0$ syndrome value.

If a nonzero $S_0$ syndrome is detected by nonzero detector 222, an error signal may be latched in storage register 218 and reported over the xc0error line 228. Similarly, a nonzero $S_1$ syndrome detected by nonzero detector 224 may be latched by the combination of multiplexer 238 and shift register 220 in accordance with the xc1check signal supplied on the select line 234 of multiplexer 238, and reported as the xc1error signal over line 230.

The upper half of the circuit 200 in the sequencer 109 optionally performs a read path LBA verification test. Because the upper and lower halves of the circuit 200 each function both as an encoder and as a syndromer, a DIB word based on the data portion of the incoming first cross-check word can be generated and compared to the $DIB/XCHK_0'$ word from the medium 122 during the same time cross-check syndromes are generated by the circuit 200.

If implemented, this LBA check is performed during the last word clock cycle when the multiplier 225 output corresponds to the redundancy $d_0''$ illustrated in FIG. 2. The $d_0''$ redundancy is added modulo 2 by XOR gate array 232 to the LBA word provided over the LBA_word bus 207 to create the regenerated DIB word $x_N''$. The regenerated word $x_N''$ is then fed back to the input XOR gate array 203 over the feedback bus 212 and bitwise compared to the word $x_N' = XCHK_0'$, which is input to the XOR gate array 203 over the wordinpt bus 202 at the same time. If the result of this comparison, as detected by nonzero detector 222, is nonzero, an error signal may be reported to the sequencer 109 and/or the micro-controller 112 as previously described.

The data path logic into the circuit 200 provides that the syndrome $S_0$ is calculated based on the first cross-check codeword read back from the medium 122:

$$\{c_0', c_1', \ldots c_{N-1}', c_N'\},$$

and that the syndrome $S_1$ is calculated based on the second cross-check codeword read back from the medium 122:

$$\{c_0', c_1', \ldots c_{N-1}', c_{N+1}'\}.$$

4. Galois Field Extension Field Operations

Multiplication and addition operations performed by Galois field multipliers 225 and 227 and the Galois field adders of the circuit 200 are performed on an extension field basis over a $GF(2^8)$ subfield of $GF(2^{16})$. Use of a smaller subfield of the Galois field to perform multiplication operations as taught herein, for example, offers significant advantages in that it simplifies the required logic and reduces implementation gate counts over non-extension field direct multiplier designs. The presently preferred $GF(2^{16})$ is described as an extension field of the following subfields:

$GF(2^4)$ is an extension field of $GF(2)$ and is generated by the polynomial $P(X) = X^4 + X + 1$, irreducible over $GF(2)$, using $\gamma^1 = 0x02$ as a primite element of $GF(2^4)$.

$GF(2^8)$ is an extension field of $GF(2^4)$ defined using the polynomial $P(Z) = Y^2 + Y + f_0$, irreducible over $GF(2^4)$, where $f_0 = 8$, and $\alpha^1 = 0x12$ is a primitive element of $GF(2^8)$.

The extension field $GF(2^{16})$ is defined by:

$$P(Z) = Z^2 + Z + g_0$$

where $g_0 = 0x81$ and $\beta^1 = 0x101$ is a primitive element of $GF(2^{16})$. For an additional discussion of the mechanics of Galois field extension field theory, the reader is referred to copending and commonly assigned application Ser. No. 08/490,345, entitled, "Dedicated GF-ALU Architecture for 10-bit Reed-Solomon Error Correction Module," the disclosure of which is hereby incorporated by reference in its entirety.

5. Verilog Code Listing

The following Verilog program sets forth the program codes needed to synthesize the combined encoder/syndromer and checker circuit 200 illustrated at a functional level in FIG. 4. In this code listing, the following conventions are employed: "x" means hexadecimal (base 16); "b" means binary (base 2); "d" means decimal (base 10); "!" means not; "& " means logical AND, and "~" means the logical NOT or inversion operation.

```
module dib(lbadress,
          wrdinput,
          wrdoutpt,
          ckenable,
          syncrstn,
          asynrstn,
          lastword,
          dicclock,
          goodsect);
input   [15:0]   lbadress;
input   [15:0]   wrdinput;
output  [15:0]   wrdoutpt;
input            ckenable;
input            syncrstn:
input            lastword;
input            dicclock;
output           goodsect;
wire    [7:0]    hilbaddr;
wire    [7:0]    lolbaddr;
wire    [7:0]    hibytinp;
wire    [7:0]    lobytinp;
wire    [7:0]    hichkout;
wire    [7:0]    lochkout;
wire    [7:0]    hichkinp;
wire    [7:0]    lochkinp;
wire    [7:0]    hiencinp;
wire    [7:0]    loencinp;
wire    [7:0]    hiencreg;
wire    [7:0]    loencreg;
wire             enresetn;
wire             rallzero;
assign hilbaddr = lbadress [15:8];
assign lolbaddr = lbadress [7:0];
assign hibytinp = wrdinput [15:8];
assign lobytinp = wrdinput [7:0];
assign wrdoutpt = {hichkout, lochkout};
cmbindic cmdic (.hilbaddr(hilbaddr),
          .lolbaddr(lolbaddr),
          .hiencinp(hiencinp),
          .loencinp(loencinp),
          .hiencreg(hiencreg),
          .loencreg(loencreg),
          .hibytinp(hibytinp),
          .lobytinp(lobytinp),
          .hichkinp(hichkinp),
          .lochkinp(lochkinp),
          .ckenable(ckenable),
          .syncrstn(syncrstn),
          .enresetn(enresetn),
          .erstregn(erstregn),
          .rallzero(rallzero));
regerdic rgdic (.dicclock(dicclock),
          .ckenable(ckenable),
          .lastword(lastword),
          .hichkinp(hichkinp),
          .lochkinp(lochkinp),
          .hiencinp(hiencinp),
          .loencinp(loencinp),
          .rallzero(rallzero),
          .hiencreg(hiencreg),
          .loencreg(loencreg),
          .hichkout(hichkout),
          .lochkout(lochkout),
          .enresetn(enresetn),
          .erstregn(erstregn),
          .goodsect(goodsect),
          .asynrstn(asynrstn));
endmodule
module cmbindic(hilbaddr,
          lolbaddr;
          hiencinp,
          loencinp,
          hiencreg,
          loencreg,
          hibytinp,
          lobytinp,
          hichkinp,
          lochkinp,
          ckenable,
          syncrstn,
```

-continued

```
                        enresetn,
                        erstregn,
                        rallzero);
input      [7:0]    hilbaddr;
input      [7:0]    lolbaddr;
output     [7:0]    hiencinp;
output     [7:0]    loencinp;
input      [7:0]    hiencreg;
input      [7:0]    loencreg;
input      [7:0]    hibytinp;
input      [7:0]    lobytinp;
output     [7:0]    hichkinp;
output     [7:0]    lochkinp;
input               ckenable;
input               syncrstn;
output              enresetn;
input               erstregn;
output              rallzero;
wire       [7:0]    hibyinit;
wire       [7:0]    lobyinit;
wire       [7:0]    hisumone;
wire       [7:0]    hisumtwo;
wire       [7:0]    losumone;
wire       [7:0]    lomultip;
assign rallzero = ( ~ ( | lochkinp)) & ( ~ ( | hichkinp));
assign enresetn = syncrstn & (ckenable | erstregn);
assign hibyinit = {8{erstregn}} & hiencreg;
assign lobyinit[7:1] = {7{erstregn}} & loencreg[7:1];
assign lobyinit[0] = ( ~ erstregn) | loencreg[0];
assign hisumone = hibytinp ^ hibyinit;
assign losumone = lobytinp ^ lobyinit;
mult0x53 mult1(.y(losumone),.z(lomultip));
assign hisumtwo = losumone ^ hisumone;
mult0x53 mult2(.y(hisumtwo),.z(hiencinp));
assign hichkinp = hilbaddr ^ hiencinp;
assign loencinp = hisumtwo ^ lomultip;
assign lochkinp = lolbaddr ^ loencinp;
endmodule
module regerdic (dicclock,
                        ckenable,
                        lastword,
                        hichkinp,
                        lochkinp,
                        hiencinp,
                        loencinp,
                        rallzero,
                        hiencreg,
                        loencreg,
                        hichkout,
                        lochkout,
                        enresetn,
                        erstregn,
                        goodsect,
                        asynrstn);
input               dicclock;
input               ckenable;
input               lastword;
input      [7:0]    hichkinp;
input      [7:0]    lochkinp;
input      [7:0]    hiencinp;
input      [7:0]    loencinp;
input               rallzero;
output     [7:0]    hiencreg;
output     [7:0]    loencreg;
output     [7:0]    hichkout;
output     [7:0]    lochkout;
input               enresetn;
output              erstregn;
output              goodsect;
input               asynrstn;
reg        [7:0]    hiencreg;
reg        [7:0]    loencreg;
reg        [7:0]    hichkout;
reg        [7:0]    lochkout;
reg                 erstregn;
reg                 goodsect;
always @ (posedge dicclock or negedge asynrstn)
    begin
        if (!asynrstn)
            erstregn < = 1'b0;
```

-continued

```
        else
            erstregn < = enresetn;
    end
always @ (posedge dicclock)
    begin
        hichkout < = ({8{lastword}} & hichkinp) | ({8{ ~ lastword}} & hichkout);
        lochkout < = ({8{lastword}} & lochkinp) | ({8{ ~ lastword}} & lochkout);
        goodsect < = ( lastword & rallzero) | ( ( ~ lastword) & goodsect);
        hiencreg < = ({8{ckenable}} & hiencinp) | ({8{ ~ ckenable}} & hiencreg);
        loencreg < = ({8{ckenable}} & loencinp) | ({8{ ~ ckenable}} & loencreg);
    end
endmodule
module mult0x53(y,z);
input    [7:0]  y;
output   [7:0]  z;
wire     [7:0]  alpha0y;
wire     [7:0]  alpha1y;
wire     [7:0]  alpha2y;
wire     [7:0]  alpha3y;
wire     [7:0]  alpha4y;
wire     [7:0]  alpha5y;
wire     [7:0]  alpha6y;
assign alpha0y = y;
assign alpha1y = {alpha0y[6:0],1'b0} ^ ({8{alpha0y[7]}} & 8'd29);
assign alpha2y = {alpha1y[6:0],1'b0} ^ ({8{alpha1y[7]}} & 8'd29);
assign alpha3y = {alpha2y[6:0],1'b0} ^ ({8{alpha2y[7]}} & 8'd29);
assign alpha4y = {alpha3y[6:0],1'b0} ^ ({8{alpha3y[7]}} & 8'd29);
assign alpha5y = {alpha4y[6:0],1'b0} ^ ({8{alpha4y[7]}} & 8'd29);
assign alpha6y = {alpha5y[6:0],1'b0} ^ ({8{alpha5y[7]}} & 8'd29);
assign z = alpha0y ^ alpha1y ^alpha4y ^alpha6y;
endmodule
```

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. A method of verifying a logical block address of a data block transmitted over a data path comprising the steps of:

(a) encoding the data block at a first point in the data path in accordance with a data integrity code to generate a first redundant symbol associated with the data block;

(b) incorporating a first logical block address of the data block into said first redundant symbol to generate a first data integrity block symbol;

(c) appending said first data integrity block symbol to the data block;

(d) transmitting the data block with said appended first data integrity block symbol to a second point in the data path;

(e) encoding the data block received at said second point in the data path according to said same data integrity code to generate a second redundant symbol associated with the data block;

(f) incorporating a second logical block address into said second redundant symbol to generate a second data integrity block symbol, said second logical block address being the same as said first logical block address in the absence of a logical block address error; and (g) comparing said first data integrity block symbol to said second data integrity block symbol to verify the logical block address of the data block after transmission over the data path, wherein the inclusion of the logical block address in the data integrity block symbol at plural points in the data path enables debugging of system software and overall data transfer reliability enhancement.

2. A method of protecting a data block passed through a buffer memory comprising the steps of:

(a) transmitting the data block to a first cross-cbeck encoder and to the buffer memory;

(b) encoding the data block in said first cross-check encoder according to a cross-check code to generate a first redundant symbol associated with the data block;

(c) incorporating a first logical block address of the data block into said first redundant symbol to generate a first data integrity block symbol;

(d) appending said first data integrity block symbol to the data block in the buffer;

(e) transmitting the data block and said appended data integrity block symbol from the buffer to a second cross-check encoder;

(f) encoding the data block in said second cross-check encoder according to said cross-check code, said second cross-check encoder generating a second redundant symbol for the data block;

(g) incorporating a second logical block address into said second redundant symbol to generate a second data integrity block symbol, said second logical block address being equivalent to said first logical block address in the absence of a logical block address error; and (h) comparing said appended first data integrity block symbol to said second data integrity block symbol to determine whether a data transmission error has occurred, wherein the encoding of a redundant symbol and an associated data integrity block symbol at plural points in a data path enables detection and correction of errors in data words as well as cross-check words.

3. An apparatus for including logical block address information in encoded data transmitted between a data source and a receiving end in a data channel comprising:

a first encoder receiving a data block from the transmission source and outputting a first redundant word for said data block;

a first logical block address source comprising a counter circuit, said first source generating a first logical block address for said data block;

a first combination means electrically connected to said first encoder and said first logical block address source for combining said first logical block address and said first redundant word;

a second encoder connected through said data channel to said first encoder and to the data source, said second encoder generating a second redundant word for said data block;

a second logical block address source comprising a second counter circuit, said second source generating a second logical block address for said data block;

a second combination means electrically connected to said second encoder and said second source for combining said second logical block address and said second redundant word; and means for comparing said first redundant word including logical block address with said second redundant word including logical block address.

4. The apparatus of claim 3 further comprising a buffer located in the data channel between said first encoder and said second encoder, said buffer selectively receiving, storing and transmitting said data block being passed between the source and receiving end.

5. The apparatus of claim 3 wherein said first and said second encoders each implement an identical code, said code also being used as a cross-check code.

6. The apparatus of claim 5 wherein said code is further utilized as a data integrity code.

* * * * *